United States Patent [19]

Herold et al.

[11] Patent Number: 4,893,094
[45] Date of Patent: Jan. 9, 1990

[54] FREQUENCY SYNTHESIZER WITH CONTROL OF START-UP BATTERY SAVING OPERATIONS

[75] Inventors: Barry W. Herold, Boca Raton; Omid Tahernia, Coconut Creek, both of Fla.

[73] Assignee: Motorola, Inc., Schaumburg, Ill.

[21] Appl. No.: 322,393

[22] Filed: Mar. 13, 1989

[51] Int. Cl.⁴ .............................................. H03L 7/18
[52] U.S. Cl. ..................................... 331/1 A; 331/14; 331/17; 331/25; 455/343
[58] Field of Search ..................... 331/1 A, 14, 17, 25; 455/343

[56] References Cited

U.S. PATENT DOCUMENTS

| | | | |
|---|---|---|---|
| 4,631,496 | 12/1986 | Borras et al. | 331/1 A |
| 4,673,892 | 6/1987 | Miyashita et al. | 331/14 |
| 4,743,864 | 5/1988 | Nakagawa et al. | 331/1 A |

Primary Examiner—Siegfried H. Grimm
Attorney, Agent, or Firm—William E. Zitelli; Vincent B. Ingrassia

[57] ABSTRACT

A frequency synthesizer governed by a battery saving signal having sleep and awake cycles comprises a phase locked loop and a control circuit for enhancing the restart operation of the phase locked loop at the commencement of each awake cycle of the battery saving signal. More specifically, the phase locked loop includes a phase detector for locking the frequencies generated by a reference oscillator and a voltage controlled oscillator by adjusting a signal in a storage device used for governing the voltage controlled oscillator. During the sleep and awake cycles of the battery saving signal, the oscillators and phase detector are inhibited and enabled, respectively, in their operations. In addition, the storage device maintains a desired governing signal for the voltage controlled oscillator during the sleep cycles. A problem arises as a result of the oscillators not being simultaneously effectively enabled at the commencement of an awake cycle. Consequently, one oscillator may generate an effective frequency signal before the other which causes the phase detector to adjust the stored governing signal away from its desired setting. To compensate, a control circuit is included in the frequency synthesizer to inhibit the adjustment of the governing signal until both of the oscillators are determined to be effectively enabled in response to an awake cycle of the battery saving signal. In so doing, the phase locking operation will begin at the commencement of each awake cycle with the stored governing signal at its desired setting.

8 Claims, 5 Drawing Sheets

FREQUENCY SYNTHESIZER WITH CONTROL OF START-UP BATTERY SAVING OPERATIONS

BACKGROUND OF THE INVENTION

The present invention relates to a frequency synthesizer which is governed over time in accordance with sleep and awake cycles of a battery saving signal, and more particularly, to a control circuit coupled to the frequency synthesizer for enhancing the start-up operational behavior thereof with regard to the sleep and awake battery saving cycles.

A frequency synthesizer may be used in a radio receiver, for example, to generate a channel frequency signal which is used in a demodulator section to pass received information signals only within a desired channel represented by the generated channel frequency signal. Other applications of a frequency synthesizer include tone generating circuits for an electronic organ and oscillator circuits for controlling the operational frequency of a microprocessor, for example.

A frequency synthesizer generally includes a reference oscillator which generates a very stable reference frequency signal and another oscillator which is controlled by a voltage potential to generate the channel frequency signal. A feedback frequency signal is developed from the channel frequency signal via a divide by N circuit. A phase detector circuit operates to converge the phase of the feedback frequency signal to the phase of the reference frequency signal by adjusting the governing voltage potential of the voltage controlled oscillator. The elements of the phase detector, the voltage controlled oscillator, and the divide by N counter constitute, in combination, what is generally referred to as a phase locked loop.

In most phase locked loops, a storage device such as a capacitor, for example, is coupled between the phase detector and voltage controlled oscillator. The phase detector may govern the sourcing and sinking of current to and from the capacitor in order to adjust the voltage thereacross which governs the channel frequency of the signal generated by the voltage controlled oscillator. An example of such a phase locked loop is described in U.S. Pat. No. 4,167,711 issued to George Smoot on Sep. 11, 1979 and assigned to the same assignee as the instant application.

Certain electronic devices utilizing a frequency synthesizer, like radio receivers, for example, may be portable and powered by a battery. A battery saving circuit is generally included as part of such battery powered devices in order to conserve the usage of energy and prolong the life of the battery. An example of such a battery saving system for a radio receiver is described in U.S. Pat. No. 4,631,496 issued to Borras et al. on Dec. 23, 1986 and assigned to the same assignee as the instant application. Normally, the battery saving circuit generates a periodic signal having a duty cycle comprising sleep and awake cycles. During the sleep cycles, certain circuits of the radio receiver including the frequency synthesizer are rendered inoperative in order to conserve energy drain from the battery source. Correspondingly, during the awake cycles, such circuits are made operative to perform their respective operations.

The reference oscillator, the voltage controlled oscillator, and the phase detector circuits are generally governed by the battery saving signal. More specifically, the reference oscillator and voltage controlled oscillator are inhibited from generating their respective frequency signals during the sleep cycles and restarted at the commencement of each awake cycle. In addition, the charging circuit, which is governed by the phase detector to adjust the voltage across the storage capacitor, is rendered in a floating condition during the sleep cycles such that such capacitive stored voltage may be maintained throughout the sleep cycle to enhance the start up time of the phase locked loop at the commencement of each awake cycle.

It is recognized that the reference oscillator and voltage controlled oscillator both require a start up time interval after enablement by the battery saving signal in order to settle and stabilize and generate an effective frequency signal. It is further recognized that when the frequency synthesizer is used in a receiver for demodulation, the information developed by the demodulation circuitry of the receiver is unreliable throughout this start up time interval. Accordingly, in order to compensate for these undesirable start up conditions, the sleep cycles are generally made shorter in the periodic battery saving signal.

The technique of floating the charging circuit and maintaining the voltage across the storage element throughout the sleep interval ensures that the voltage controlled oscillator will generate a signal at a desired frequency at each start up. However, this technique is corrupted by the observation that it is highly unlikely that the reference oscillator and voltage controlled oscillator will produce effective frequency signals concurrently upon being awakened. Since these frequency signals govern the operation of the phase locked loop, if one frequency signal is rendered effective before the other after both oscillators have been awakened, the phase detector will respond solely to the effective frequency signal to alter the maintained voltage of the storage device substantially away from that which was presumed to be a desirable start up value. If left uncompensated, this perturbation in oscillator controlled voltage may cause a longer start up time for the oscillators and the phase locked loop which would lead to shorter sleep cycles and, ultimately, shorter battery life.

Thus, it is believed of paramount importance to ensure that the desired start up voltage for the voltage controlled oscillator is maintained from the commencement of each awake cycle throughout the start up settling and stabilization periods of the oscillator circuits to guarantee a faster phase locked condition for the frequency synthesizer to produce the desired channel frequency. In so doing, an effective channel frequency signal is produced in a shorter period of time, thus allowing for longer sleep cycles which should prolong the life of the battery source.

SUMMARY OF THE INVENTION

In accordance with the present invention, a frequency synthesizer governed by a battery saving signal having sleep and awake cycles for inhibiting and enabling, respectively, the generation of a synthesized frequency signal includes a control means for enhancing the start-up operations at the commencement of each awake cycle. More specifically, the frequency synthesizer comprises first means for generating a reference frequency signal and second means controlled by a governing signal to generate a feedback frequency signal representative of the synthesized frequency signal. The first and second means are governed by the battery saving signal to enable and inhibit the generation of their respective reference and feedback frequency signals during the awake and sleep cycles, respectively, thereof. The frequency synthesizer further includes storage means for maintaining the governing signal, means governed by the battery saving signal to adjust the governing signal of the storage means in response to the reference and feedback frequency signals solely during the awake cycles of the battery saving signal, and control means governed by the battery saving signal, the reference frequency signal and the feedback frequency signal to inhibit the adjustment of the governing signal by the adjusting means until both of the first and second generating means are determined to be effectively enabled in response to an awake cycle of the battery saving signal.

In one embodiment, the control means includes third means for testing the reference and feedback frequency signals to determine the initial time in an awake cycle when both such signals are effectively generated by their respective generating means and to generate a set signal at such determined initial time, means for generating a reset signal at the commencement of a sleep cycle of the battery saving signal, and means governed by the set and reset signals to enable and inhibit adjustment, respectively, of the governing signal by the adjusting means.

DESCRIPTION OF THE PREFERRED EMBODIMENT

Figure 1:
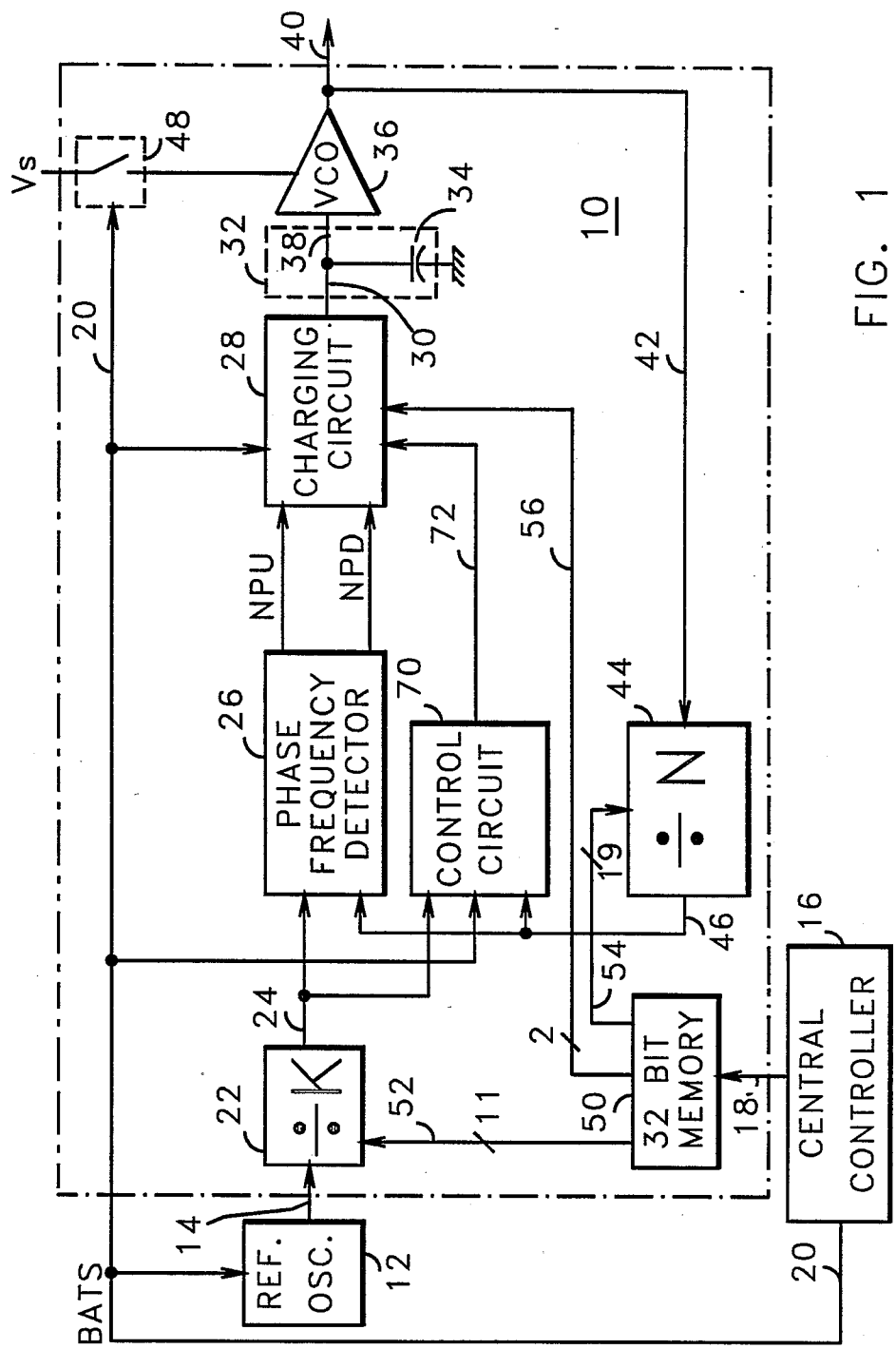
FIG. 1 is a block diagram schematic of a frequency synthesizer suitable for embodying the broad principles of the present invention.

Shown within dot-dashed lines in FIG. 1, as part of the frequency synthesizer, is a phase locked loop 10. Ancillary to the phase locked loop 10, but essential to the operation of the frequency synthesizer, are a reference oscillator 12 which generates a very stable reference frequency signal over signal line 14, and a central controlled 16 which provides digital control and data signals to the phase locked loop over signal lines 18. The central controller 16 may also be used to generate a battery saver signal over signal line 20. In the present embodiment, the reference frequency signal 14 is provided to a divide by K prescaler circuit 22 and the resulting signal therefrom is provided over signal line 24 to one input of a phase detector circuit 26. Command signals NPU and NPD generated by the detector circuit 26 are coupled to a charging circuit 28 which has an output 30 coupled to a storage device 32 which may include a capacitor 34 coupled between the signal line 30 and ground potential. A signal representative of the voltage potential across the storage capacitor 34 may be coupled to a voltage controlled oscillator 36 utilizing signal line 38. The oscillator 36 generates a signal, having a frequency commensurate with the voltage potential of signal line 38, over signal line 40 for use by an electronic device such as a radio receiver, for example. The frequency signal may be conducted over signal line 42 to a divide by N circuit 44. The output of the divider circuit 44, referred to as the feedback frequency signal, is conducted to the phase detector 36 over signal line 46.

Figure 2:
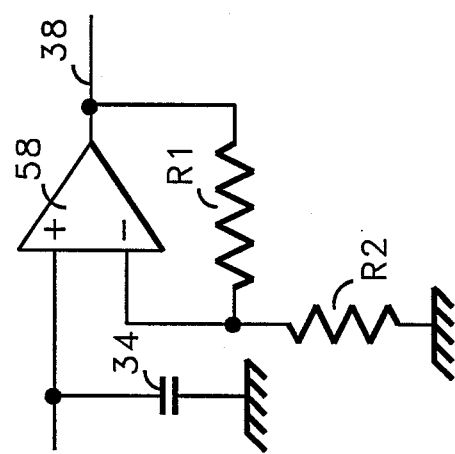
FIG. 2 is a circuit schematic of an alternate embodiment of a storage device suitable for use in the frequency synthesizer depicted in FIG. 1.

An alternate embodiment of the storage device 32 is shown in the schematic of FIG. 2 wherein an active device such as an operational amplifier, for example, is coupled between the capacitive element 34 and oscillator circuit 36. More specifically, the capacitor 34 may be coupled to the non-inverting (+) input of an operational amplifier 58 and the inverting (−) input thereof may be coupled to the node of series connected resistors R1 and R2 which are coupled between the output of amplifier 58 and ground. The output of operational amplifier 58 generates an amplified voltage signal, proportional to the voltage across the capacitor 34. The generated voltage signal is conducted to the oscillator 36 over signal line 38 for controlling the frequency of the oscillator generated signal.

Referring back to FIG. 1, the battery saving signal of line 20 may be coupled to the reference oscillator 12, the charging circuit 28, and a switch 48 operative to connect and disconnect a battery supply Vs to the voltage controlled oscillator 36 for energization and enablement thereof. Moreover, the central controller 16 may provide from time to time, for programming purposes, 32 bits of information to a memory circuit 50 which distributes the digital information to the prescaler circuit 22, the charging circuit 28, and the divide by N circuit 44. More specifically, 11 bits of data are provided to the prescaler circuit 22 over data lines 52 to set the value of K thereof. In addition, 19 bits of data are conducted to the circuit 44 over data lines 54 to set the value of N in the operation thereof. Further, two bits of data are conducted from the memory 50 to the charging circuit 28 over data lines 56 to set phase loop bandwidth therein.

Figure 4:
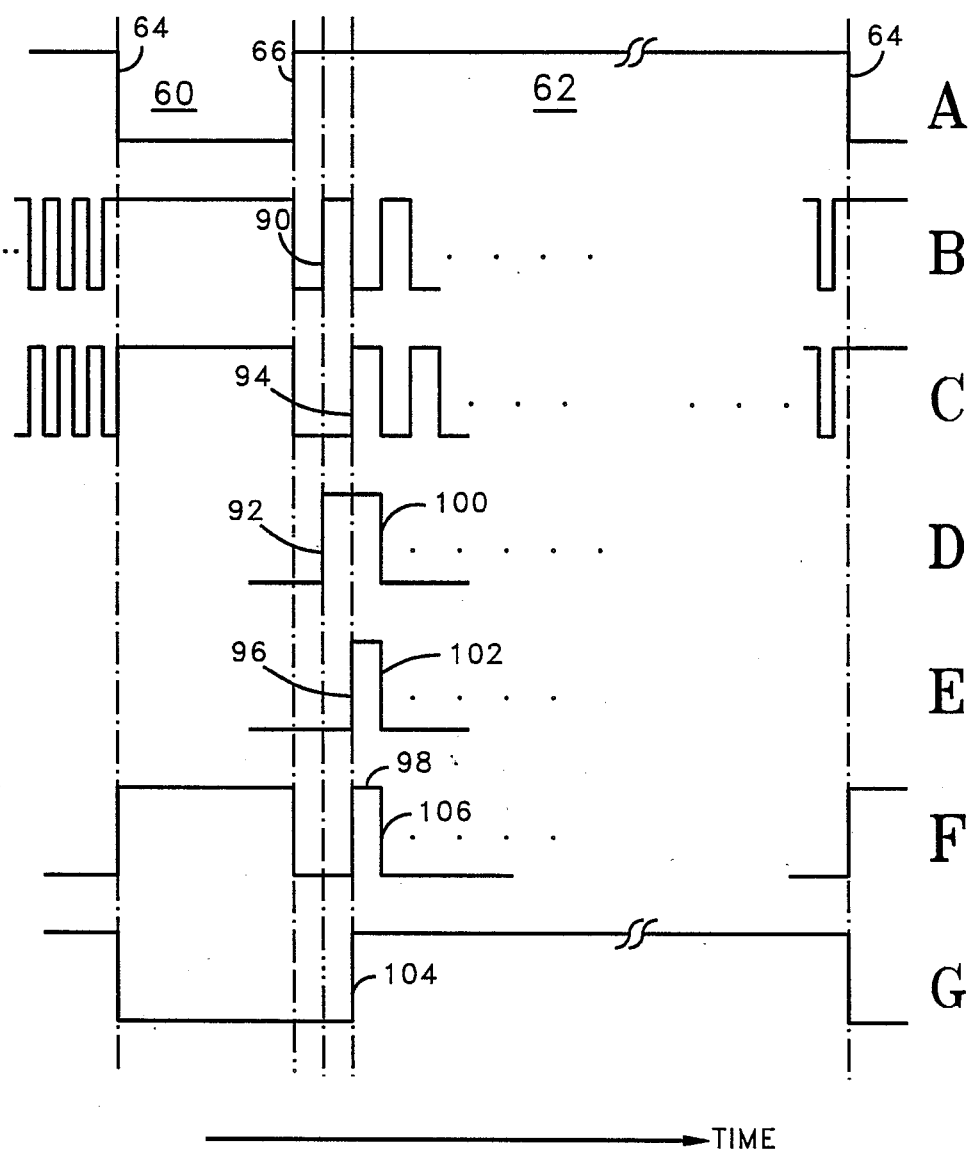
FIG. 4 depicts timing waveforms A-G which illustrate an operation of the control circuit embodiment depicted in FIG. 3.

In a typical operation, the battery saving signal 20 may be generated with periodic sleep and awake cycles as exemplified by the waveform A in FIG. 4. The sleep cycles of the waveform A are characterized by the signal going low for duration 60 and the awake cycles are characterized by the signal going high for the duration 62. The commencement of the sleep cycles is shown at the edges 64, and the commencement of the awake cycles is shown at the signal edges 66. During the sleep cycles 60 of the battery saving signal, the oscillators 12 and 36 are governed to inhibit the generation of their respective frequency signals which substantially reduces the energy drain on the battery source Vs. Also, during the sleep cycles 60, the output line 30 of the charging circuit 28 is governed to a floating state in order to maintain the voltage potential across the storage capacitor 34 for the duration of each sleep cycle.

During the awake cycles 62 of the battery saving signal, the oscillators 12 and 36 are enabled to generate their respective frequency signals, and the charging circuit 28 is enabled to adjust the voltage potential across the capacitive element 34 as governed by the phase detector command signals NPU and NPD. More specifically, the phases of the reference and feedback frequency signals are compared by the phase detector 26 which issues current sourcing and current sinking command signals NPU and NPD to the charging circuit 28 to source and sink current over signal line 30 to adjust the voltage across the capacitive element 34. A signal representing the adjusted voltage is conducted to the oscillator 36 over signal line 38 to control the frequency of its generated signal which may be conducted over signal line 40 for use as a channel frequency signal in the demodulation section of a radio receiver, for example. The channel frequency signal is divided by N in the circuit 44 and the resultant signal is fed back to the phase detector 36 over signal line 46. This operation is well known and is characterized as phase locking the feedback frequency signal 46 to the very stable reference frequency signal 24. When the two frequency signals are substantially in phase, the synthesized frequency of the signal 40 becomes the prescaled reference frequency multiplied by the value of N of circuit 44.

The central controller 16 may from time to time provide new values for the prescaler K and the divider N in order to change the frequency of the signal 40 between predetermined channels. Concurrently with the switching of synthesized frequency, the loop bandwidth of the phase locked loop 10 may be altered to a high loop bandwidth setting by the two bits of data 56 provided to the charging circuit 28 which operation provides for a more expeditious phase lock in the dynamics of switching from one synthesized frequency to another. As the loop 10 approaches a phase lock condition, the loop bandwidth may be changed again to a low loop bandwidth setting by the central controller 16 via new data over signal line 18 to the memory 50 which conducts the loop bandwidth governing signals over signal lines 56 to the charging circuit 28. This technique of switching between loop bandwidths will be described in greater herein below.

As described in the background section of this application, at the commencement 66 of an awake cycle 62, the oscillators 12 and 36 are not immediately effectively enabled, i.e. they do not immediately begin generating effective or viable frequency signals, but rather require a period of time to settle and stabilize before generating their respective desired frequency signals having positive and negative sloping edges between adequate amplitude levels. Present frequency synthesizers permit the charging circuit 28 to begin sourcing and sinking current to the capacitor 34 as commanded by the phase detector circuit 26 at the commencement 66 of an awake cycle 62. When one frequency signal is effectively generated before the other, which is more than likely the case, the phase detector 26 responds by commanding the charging circuit 28 to adjust the voltage of the storage device 32 which controls the oscillator 46. Accordingly, the voltage potential may be altered substantially away from its desired setting, i.e. the level which was maintained through the sleep cycle, so that phase lock will not be completed at the end of the oscillator start up time but rather will require further time in order to readjust the voltage across the capacitive element 34 back to its desired setting.

In order to compensate for this undesirable behavior in operation of the phase locked loop under battery saving control, a control circuit 70 is included as part of the phase locked loop 10 of the frequency synthesizer. The reference frequency signal 24, feedback frequency signal 46, and battery saving signal 20 are provided as inputs to the control circuit 70. An output control signal from the circuit 70 is conducted over signal line 72 to the charging circuit 28 to govern the operation thereof. In operation, the control circuit 70 is governed by the battery saving signal 20, the reference frequency signal 24, and the feedback frequency signal 46 to inhibit the adjustment of the governing voltage potential across the capacitive element 34 by the charging circuit 28 until both of the oscillator circuits 12 and 36 are determined to be effectively enabled in response to an awake cycle of the battery saving signal 20. More specifically, the control circuit 70 tests the reference and feedback frequency signals to determine the initial time in an awake cycle 62 when both such signals are effectively generated by their respective generating means 12 and 36 and to control the charging circuit at such determined initial time to begin adjustment of the governing voltage potential.

Figure 3:
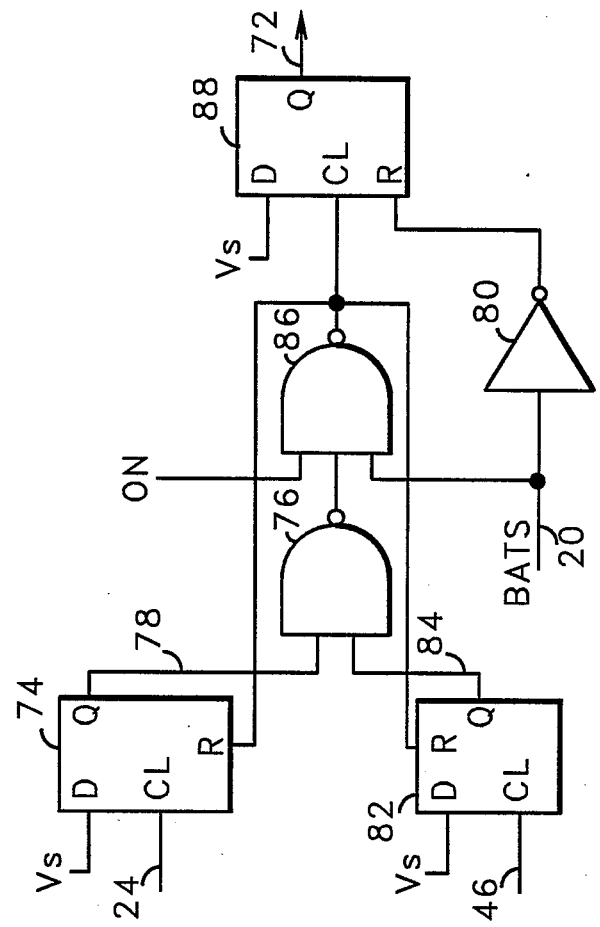
FIG. 3 is a logic circuit schematic of an embodiment suitable for use as a control circuit of the frequency synthesizer depicted in FIG. 1.

A suitable embodiment for the control circuit 70 of the frequency synthesizer is shown in the circuit schematic diagram of FIG. 3. Referring to FIG. 3, the reference frequency signal is conducted over signal line 24 to the clock input of a D-type flip-flop 74 which has its Q output coupled to one input of a NAND gate 76 over signal line 78. The data input D of the flip-flop 74 may be coupled to a voltage supply Vs having a sufficient amplitude level to constitute a logical 1. The battery saving signal may be coupled over signal line 20 to one input of the NAND gate 86 and also to an input to an inverter gate 80. Another input of NAND gate 86 may be coupled to a signal "ON" which may be supplied to the control circuit 70 for the charging circuit 28. The "ON" signal will be described in greater detail herebelow in connection with FIG. 5A. In addition, the feedback frequency signal may be coupled to the clock input of another D type flip-flop 82 over signal line 46. The Q output of flip-flop 82 may be coupled to another input of the NAND gate 76 over signal line 84. The data input D of flip-flop 82 may also be coupled to the voltage potential Vs.

The output of the NAND gate 76 may be coupled to another input of NAND gate 86, the output of which being coupled to reset R inputs of the flip-flops 74 and 82 and also to the clock input of another D type flip-flop 88. The data input D and reset input R of the flip-flop 88 may be coupled respectively to the supply Vs and the output of the inverter gate 80. In addition, the Q output of the flip-flop 88 becomes the enabling/inhibiting control signal conducted to the charging circuit 28 over signal line 72.

As has been described above, the oscillators 12 and 36 are considered to be effectively enabled within an awake cycle of the battery saving signal when they generate their respective frequency signals having positive and negative sloping edges between adequate amplitude levels. For the present embodiment, the test for determining when both of the oscillators 12 and 36 first become effectively enabled is by determining when a selected one of such sloping edges first occurs in an awake cycle for both of the reference and feedback frequency signals. At such time, the control circuit 70 generates an enabling signal over signal line 72 to the charging circuit 28 to initiate the charging operations thereof. Accordingly, until such time, the adjustment of the governing voltage potential is inhibited and thus such voltage potential is maintained substantially at the desired level throughout the oscillator start up time.

Because of the use of D type flip-flops in the circuit embodiment of the control circuit 70 described in connection with FIG. 3, the positive sloping edge became the selected edge for effective generation detection purposes. A typical operation of such control circuit embodiment will now be described using the waveform illustrations B–G of FIG. 4. For correlation purposes, waveform B exhibits illustratively the waveform of the reference frequency signal as generated by the reference oscillator 12 governed by the battery saving signal, waveform C the feedback frequency signal, waveform D the Q output of flip-flop 74, waveform E the Q output of flip-flop 82, waveform F the output signal of NAND gate 86, and waveform G the Q output of flip-flop 88 which is the control signal 72.

Referring to FIGS. 3 and 4 then, at the commencement 64 of a sleep cycle 60, the battery saving signal 20 disables the NAND gate 86 and causes the flip-flop 88 to be reset through the inverter gate 80. In response, the control signal 72 goes low to inhibit the charging operations of the circuit 28 as described above. The control signal 72 is maintained low throughout the sleep cycle 60, and the governing voltage potential across the capacitive element 34 is maintained at the desired level. At the commencement 66 of an awake cycle 62, both oscillators 12 and 36 are enabled by the battery saving signal and the signal "ON" is set to a logical 1 via charging circuit 28. In the present example, at time 90 subsequent to the commencement time 66, a reference frequency signal is generated with a positive slope effective to clock the D type flip-flop 74 and set its output to a logical one which is shown in the waveform D at 92. At some time 94 subsequent to the time 92, the feedback frequency signal is generated by the oscillator 36 with a positive sloping edge effective to clock the D type flip-flop 82 and set its Q output to a logical 1 as shown by the waveform E at 96.

At time 96, because both inputs to the NAND gate 76 are logical 1's, its output is effected to a logical 0 driving the output of NAND gate 86 to a logical 1 which is shown by the waveform F at 98. The logical 1 signal of NAND gate 86 resets the Q outputs of the flip-flops 74 and 82 to a logical 0 state as shown at times 100 and 102, respectively, and clocks the flip-flop 88 to drive the Q output thereof to a logical 1 state as shown at 104 in waveform G. The NAND gate 76 responds to the resetting of the Q outputs of the flip-flops 74 and 82 and drives the output of NAND gate 86 to a logical 0 as shown at time 106 in waveform F. The transition of the control signal of waveform G from a logical 0 to a logical 1 at time 104 causes the circuit 28 to be enabled and commence its charging operations which will be described in greater detail here below in connection with FIGS. 5A and 5B.

Figure 5A:
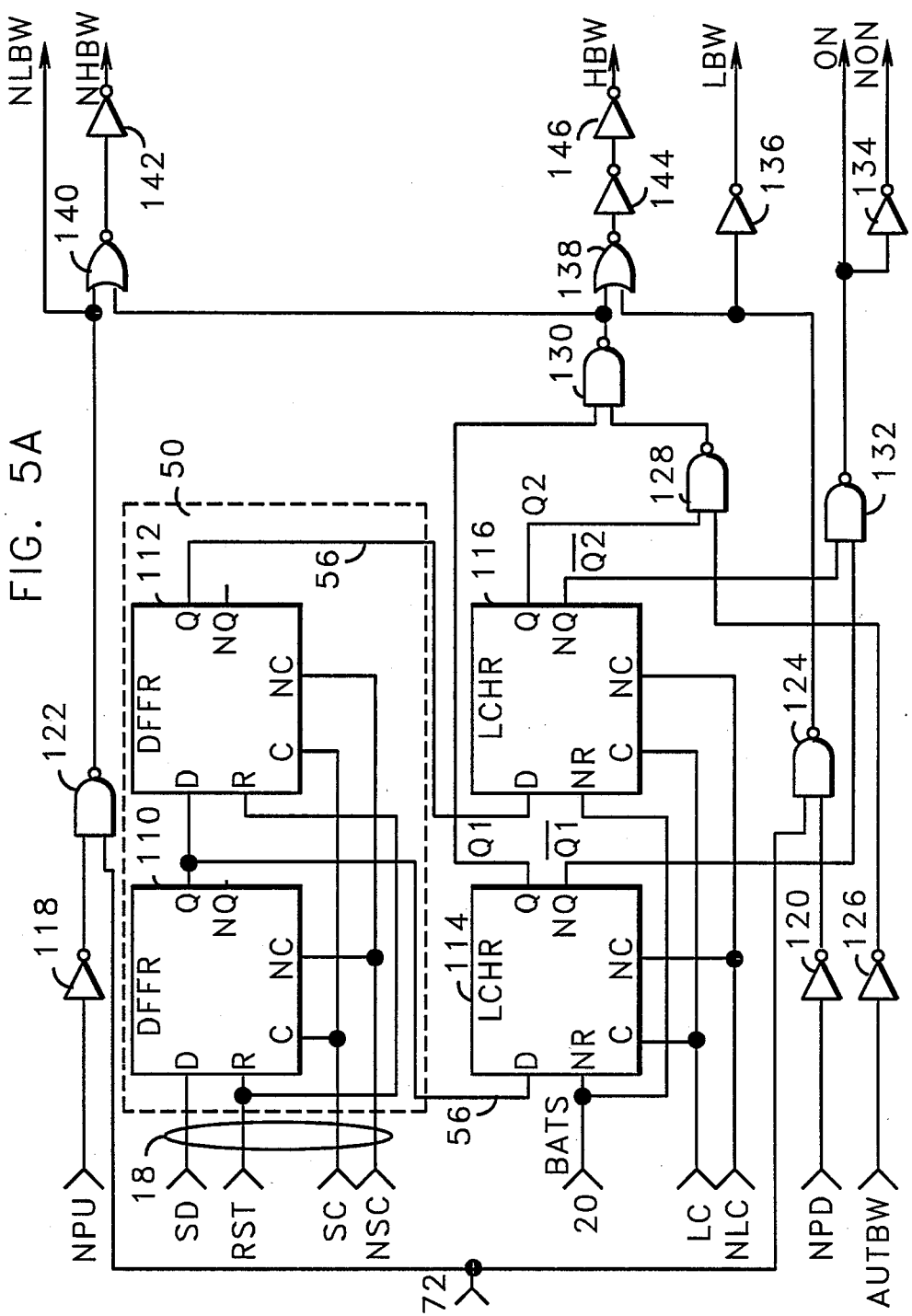
FIGS. 5A-B depict, in combination, a circuit schematic embodiment of a charging circuit suitable for use in the frequency synthesizer depicted in FIG. 1.

The charging circuit 28 may be considered as divided into two parts, one being a logical control circuit and the other being an analog charging circuit. FIG. 5A represents a suitable embodiment of the logical control section of the charging circuit 28. A section of the memory 50 containing two bits of information which are conducted over signal lines to the charging circuit 28 is depicted in FIG. 5A for completeness. D type flip-flops 110 and 112 are included in the memory section 50 to store the two bits of data. The control lines 18 coupled from the central controller 16 include a serial data path SD for providing serial digital data to the D type flip-flops of the section 50. In addition, complementary clocking signals SC and NSC are part of the signal lines 18 and used to clock the D type flip-flops of the memory section 50 in order to store the serial digital data provided over line SD. Still further, a reset signal RST is provided as part of the control lines to reset the flip-flops of the memory section 50.

The digital control bits 56 are conducted to corresponding D-type latches 114 and 116 of the charging circuit as depicted in FIG. 5A. In addition, the battery saver signal over signal line 20 is coupled to a reset input of each of the latches 114 and 116. Still further, complementary clocking signals LC and NLC are coupled to the flip-flops 114 and 116 to provide control for the storage of the respective digital bits therein. The stored digital data bits of flip-flops 114 and 116 will hereinafter be referred to as Q1 and Q2, respectively, and their complements will hereinafter be referred to as $\overline{Q1}$ and $\overline{Q2}$.

Referring to FIG. 5A, the command signals NPU and NPD are coupled respectively through inverter gates 118 and 120 to one input of NAND gates 122 and 124, respectively. The control signal line 72 is coupled to another input of the NAND gates 122 and 124. An auto bandwidth signal AUTBW is coupled through an inverter gate 126 to one input of another NAND gate 128. Another input of the NAND gate 128 is coupled to the signal line of Q2. The signal line of Q1 is coupled to one input of another NAND gate 130 which has another input thereof coupled to the output of the NAND gate 128. The signal lines $\overline{Q1}$ and $\overline{Q2}$ are coupled to two inputs of a NAND gate 132, the output of which effecting a signal ON which is coupled through an inverter gate 134 to effect the complement NON thereof. The signal ON is coupled to the control circuit 70 for use therein as described in connection with the embodiment of FIG. 3.

The output of the NAND gate 124 is coupled through an inverter gate 136 to effect a control signal LBW and also coupled to one input of a NOR gate 138. In addition, the output of the NAND gate 130 is coupled to another input of the NOR gate 138 and to an input of another NOR gate 140. Still further, the output of the NAND gate 122 effects a control signal NLBW and is coupled to the other input of the NOR gate 140. Finally, the output of the NOR gate 140 is coupled through an inverter gate 142 to produce another control signal NHBW, and the output of the NOR gate 138 is coupled through a pair of cascaded inverter gates 144 and 146 to effect still another control signal HBW. The control signals NLBW, NHBW, HBW, and LBW are used in the charging circuit 28 to control MOSFET switches for the sourcing and sinking of current over signal line 30 to the storage capacitor 34.

Figure 5B:
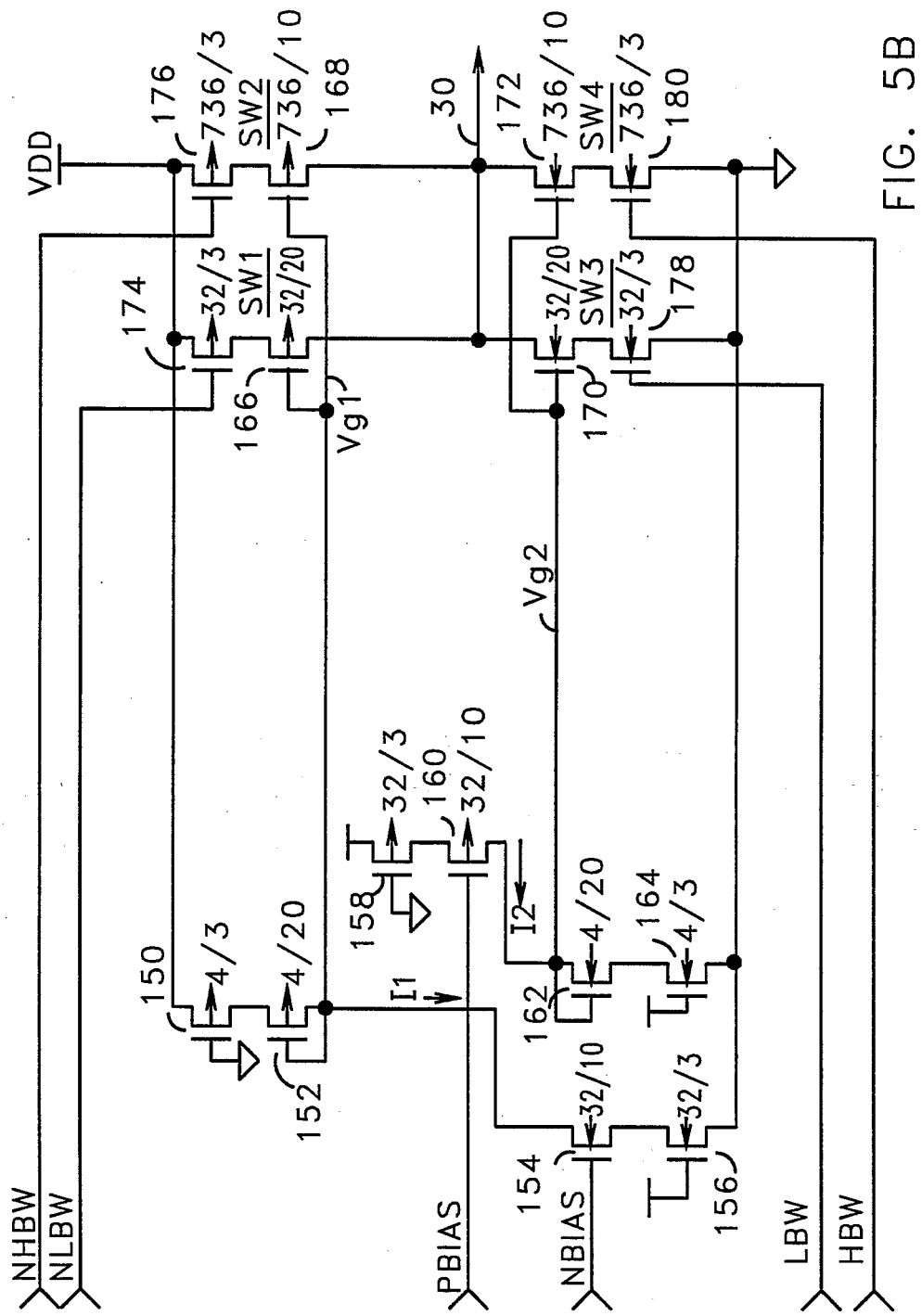

More specifically, referring to FIG. 5B, MOSFET transistors are constructed in a circuit arrangement to form current mirrors which set the current levels for low bandwidth and high bandwidth phase locked loop states. The numbers shown alongside each of the MOSFET transistors represent their respective width over length ratios. The combination of MOSFET transistors 150, 152, 154, and 156 are coupled in tandem between the supply VDD and ground to effect a bias current I1 for the diode section 150, 152 of the current mirrors of the current sourcing stages. The value of the sourcing bias current I1 is set by a bias voltage NBIAS applied to the gate of the transistor 154.

Similarly, the tandem arrangement of the MOSFET transistors 158, 160, 162, and 164 coupled between the supply voltage VDD and ground effect a bias current I2 for the diode section 162, 164 of the current sinking mirror circuits. Again, the value of the bias current I2 is set by a bias voltage PBIAS applied to the gate of the transistor 160.

Still further, a voltage Vg1 is produced at the drain of the diode configured MOSFET transistor 152 and is coupled to the gates of two MOSFET transistors 166 and 168 to produce a current mirroring effect thereat. That is, the sourcing current conducted through transistor 166 is an amplification of the bias current I1 based on the width to length ratios of the transistors 152 and 166. In the present embodiment, this ratio was set at a value of 8 (low bandwidth state). Similarly, the sourcing current conducted through the transistor 168 is also an amplification of the bias current I1 for the same reasons, and for the present embodiment, the amplification was set at 400 (high bandwidth state).

In the same manner, a voltage Vg2 is effected at the source of the diode configured MOSFET transistor 162 in accordance with the value of the bias current I2. The voltage signal Vg2 is coupled to the gates of two MOSFET transistors 170 and 172 to produce the current mirroring effects for the sinking currents in both the low bandwidth and high bandwidth states as that described above for the transistors 166 and 168. For the present embodiment, the amplification settings for the transistors 170 and 172 are substantially the same as those set for transistors 166 and 168, respectively.

MOSFET transistors 174 and 176 are coupled between the transistors 166 and 168, respectively, and a voltage supply VDD. The switches 174 and 176 are controlled by the respective signals NLBW and NHBW to conduct and not conduct sourcing current through the transistors 166 and 168, respectively. Hereinafter, the coupled transistor pair 166 and 174 will be referred to as SW1 and the coupled pair of transistors 168 and 176 will be referred to as SW2. In a similar manner, the MOSFET transistors 178 and 180 are coupled between their respective transistors 170 and 172 and ground potential. The transistors 178 and 180 are controlled by the signals LBW and HBW to conduct and not conduct sinking current through their respectively coupled transistors 170 and 172. Hereinafter, the coupled pairs 170, 178 and 172, 180 will be referred to as SW3 and SW4, respectively.

In operation, in a low bandwidth state, source current may be supplied to or drained from the capacitive element 34 via signal line 30 through SW1 or SW3 as controlled by the signals NLBW and LBW, respectively. On the other hand, in a high bandwidth state, sourcing current is supplied through both SW1 and SW2 and sinking current is conducted through SW3 and SW4 as controlled by the signals LBW and HBW, respectively. For the present embodiment, the design is such that when both signals NHBW and NLBW are both logical 1's and signals LBW and HBW are both logical 0, all of the switches SW1, SW2, SW3, and SW4 are off, creating a floating state at the conduction line 30. This floating state is created during the inhibit control stage of the control signal 72 in order to maintain the voltage across the capacitive element 34.

More specifically, referring to FIG. 5A, when the control signal 72 is at a logical 0 state which represents an inhibit cycle thereof, the NAND gates 122 and 124 are disabled effecting a logical 1 at the output thereof. This results in a logical 1 and a logical 0 over the control signals NLBW and LBW, respectively, which turns switches SW1 and SW3 off and also results in a logical 1 and logical 0 for the signals NHBW and HBW, respectively, which also turns switches SW2 and SW4 off. Accordingly, with all of these switches off, the charging circuit 28 is inhibited from adjusting the voltage across the capacitive element 34 which state continues for the duration of the inhibit cycle of the control signal 72. At approximately time 104 as shown in the waveform G of FIG. 4, the control signal is changed to a logical 1 representative of the commencement of an enable cycle of the control signal 72 which change in state enables the NAND gates 122 and 124 to thereafter respond to their respective command signals NPU and NPD (see FIG. 5A).

The remaining operations of the charging circuit 28 as controlled by the command signals NPU and NPD and the signals Q1, Q2, and auto bandwidth (A) is defined for the present embodiment by the truth table provided directly here below.

TRUTH TABLE

| A | Q1 | Q2 | NPU | NPD | LBW | HBW | NLBW | NHBW | SW1 | SW2 | SW3 | SW4 |
|---|----|----|-----|-----|-----|-----|------|------|-----|-----|-----|-----|
| X | 1  | 0  | 1   | 0   | 1   | 1   | 1    | 1    | OFF | OFF | ON  | ON  |
| X | 0  | X  | 1   | 0   | 1   | 0   | 1    | 1    | OFF | OFF | ON  | OFF |
| 1 | 1  | 1  | 1   | 0   | 1   | 1   | 1    | 1    | OFF | OFF | ON  | ON  |
| 0 | 1  | 1  | 1   | 0   | 1   | 0   | 1    | 1    | OFF | OFF | ON  | OFF |
| X | 1  | 0  | 0   | 1   | 0   | 0   | 0    | 0    | ON  | ON  | OFF | OFF |
| X | 0  | X  | 0   | 1   | 0   | 0   | 0    | 1    | ON  | OFF | OFF | OFF |
| 1 | 1  | 1  | 0   | 1   | 0   | 0   | 0    | 0    | ON  | ON  | OFF | OFF |
| 0 | 1  | 1  | 0   | 1   | 0   | 0   | 0    | 1    | ON  | OFF | OFF | OFF |

While the present invention has been described in connection with a specific embodiment shown in the accompanying FIGS. 1-5B, it is understood that additions and modifications may be made to that embodiment or that other equivalent circuitry may be used without deviating from the principles of the present invention. It is clear that no single embodiment should be considered in defining the invention, but rather the invention should be construed in breadth and scope in accordance with the recitation of the appended claims hereto.

What is claimed is:

1. A frequency synthesizer governed by a battery saving signal having sleep and awake cycles, for generating a synthesized frequency signal, said frequency synthesizer comprising:

first means for generating a reference frequency signal;

second means controlled by a governing signal to generate a feedback frequency signal representative of said synthesized frequency signal, said first and second means being governed by said battery saving signal to enable and inhibit the generation of their respective reference and feedback frequency signals during the awake and sleep cycles, respectively, thereof;

storage means for maintaining said governing signal;

means governed by said battery saving signal to adjust the governing signal of said storage means in response to said reference and feedback frequency signals solely during the awake cycles of said battery saving signal; and control means governed by said battery saving signal, said reference frequency signal and said feedback frequency signal to inhibit the adjustment of said governing signal by said adjusting means until both of said first and second generating means are determined to be effectively enabled in response to an awake cycle of said battery saving signal.

2. The frequency synthesizer in accordance with claim 1 wherein the control means includes:

third means for testing the reference and feedback frequency signals to determine the initial time in an awake cycle when both such signals are effectively generated by their respective generating means and to generate a set signal at such determined initial time;

means for generating a reset signal at the commencement of a sleep cycle of the battery saving signal; and means governed by said set and reset signals to enable and inhibit adjustment, respectively, of the governing signal by the adjusting means.

3. The frequency synthesizer in accordance with claim 2 wherein the reference and feedback frequency signals include positive and negative sloping edges between adequate amplitude levels when effectively generated by their respective generating means; and wherein the third means includes means for determining when a selected one of such sloping edges first occurs in an awake cycle for both of the reference and feedback signals and generates the set signal in response thereto.

4. The frequency synthesizer in accordance with claim 3 wherein the third means includes means for determining when a proper positive sloping edge first occurs in an awake cycle for both of the reference and feedback signals and generates the set signal in response thereto.

5. The frequency synthesizer in accordance with claim 3 wherein the third means includes:

first flip-flop circuit having an input thereof coupled to the reference frequency signal for setting an output signal in response to one of the sloping edges of the reference frequency signals;

second flip-flop circuit having an input thereof coupled to the feedback frequency signal for setting an output signal in response to one of the sloping edges of the feedback frequency signals; and means for generating the set signal when the outputs of both of the first and second flip-flop circuits are first set in an awake cycle.

6. The frequency synthesizer in accordance with claim 5 wherein each flip-flop circuit includes a reset input; and wherein the set signal generating means is coupled to the reset input of both of the first and second flip-flop circuits for resetting the output signals thereof when the set signal is generated.

7. The frequency synthesizer in accordance with claim 1 wherein the storage means includes a capacitor which is coupled to said second means; wherein the adjusting means includes means for sourcing and sinking charge to and from said capacitor to adjust the voltage thereacross, which voltage being used as the governing signal; wherein the control means includes means for inhibiting the sourcing and sinking of charge to and from said capacitor until both of said first and second generating means are determined to be effectively enabled in response to an awake cycle of said battery saving signal, thereby sustaining substantially the voltage across the capacitor until both of the generating means are effectively enabled.

8. The frequency synthesizer in accordance with claim 7 wherein the adjusting means is switchable to source and sink charge to and from the capacitor in one of either a first or second charging rate.

* * * * *